United States Patent [19]

Van Berkel et al.

[11] Patent Number: 5,426,605
[45] Date of Patent: Jun. 20, 1995

[54] SEMICONDUCTOR MEMORY DEVICE

[75] Inventors: Cornelis Van Berkel, Brighton; Neil C. Bird, Horley, both of England

[73] Assignee: U.S. Philips Corporation, New York, N.Y.

[21] Appl. No.: 108,873

[22] Filed: Aug. 18, 1993

[30] Foreign Application Priority Data

Aug. 19, 1992 [GB] United Kingdom ............... 9217743

[51] Int. Cl.[6] .................................. G11C 11/34
[52] U.S. Cl. ......................... 365/182; 365/189.12; 365/230.06; 365/104
[58] Field of Search ........... 365/104, 182, 184, 189.12, 365/220, 221, 230.06

[56] References Cited

U.S. PATENT DOCUMENTS

| | | | |
|---|---|---|---|
| 4,173,766 | 11/1979 | Hayes | 365/184 X |
| 4,173,791 | 11/1979 | Bell | 365/182 |
| 4,242,737 | 12/1980 | Bate | 365/184 |
| 4,451,904 | 5/1984 | Sugiura et al. | 365/182 |
| 5,202,848 | 4/1993 | Nakagawara | 365/104 |

Primary Examiner—Joseph A. Popek
Attorney, Agent, or Firm—Steven R. Biren

[57] ABSTRACT

A semiconductor memory device includes an array of rows and columns of field effect transistors (FETs) which provide memory locations. The FET gate electrodes in each row are connected to a respective row conductor and the FET first and second main electrodes in each column are connected to respective adjacent column conductors so that the second main electrodes in one column are connected to the first electrodes of the FETs in any adjacent column. Circuitry is provided for storing data at and reading data from the memory locations. The circuitry stores data at a desired memory location by applying a first predetermined voltage $V_g^W$ to a selected row conductor and a second predetermined voltage $V_d^W$ to a selected column conductor for establishing within each FET which has its gate electrode connected to the selected row conductor and one main electrode connected to the selected column conductor an electric field for causing a change in the current conduction characteristics of the part of its conduction channel region adjacent the selected column conductor when the difference between the first and second predetermined voltages exceeds a critical voltage so that data is stored at the desired memory location which is provided by the respective part of the conduction channel region adjacent the selected column conductor of each FET connected to the selected column conductor.

16 Claims, 6 Drawing Sheets

SEMICONDUCTOR MEMORY DEVICE

BACKGROUND OF THE INVENTION

This invention relates to a semiconductor memory device.

In particular this invention relates to a semiconductor memory device, comprising an array of rows and columns of field effect transistors (FETs) providing memory locations for storing data, each FET having a conduction channel region extending between first and second main electrodes and a gate electrode for controlling conduction along the conduction channel region, and row and column conductors, the gate electrodes of the FETs in each row being connected to a respective row conductor and the first and second main electrode of the FETs in each column being connected to respective adjacent column conductors so that the second main electrodes of the FETs in one column are connected to the first electrodes of the FETs in any adjacent column. Circuitry is provided storing data at and reading data from the memory locations.

U.S. Pat. No. 4,451,904 describes such a so-called floating or virtual earth memory array in which the field effect transistors are in the form of floating gate MOS (FAMOS) transistors. U.S. Pat. No. 4,173,791 (11/6/79) describes a virtual earth memory array in which the transistors are in the form of PINOS transistors, that is insulated gate field effect transistors where the gate insulating region is provided by a layer of silicon nitride followed by a layer of silicon oxide. Data is stored by the injection of hot electrons from the drain of the transistor into the floating gate in the case of U.S. Pat. No. 4,451,904 and into the silicon nitride layer in the case of U.S. Pat. No. 4,173,791.

In such devices each transistor defines a unique memory location and in order to access a particular memory location, that is a particular transistor, an appropriate voltage is applied to the row conductor connected to the row of transistors containing the desired memory location while a voltage difference is applied across the column conductors connected to the two main electrodes of the selected transistor. So as to avoid accessing the other transistors in the same row, the column conductors adjacent the column conductor connected to one of the first and second main electrodes of the selected transistor are held at the same potential as that column conductor while the column conductors adjacent the column conductor connected to the other of the first and second main electrodes of the selected transistor are held at the same potential as that conductor. Thus, a potential difference only exists between the first and second electrodes of the transistors in the selected column.

Although such a semiconductor memory device and the above-described access method are acceptable for a bulk crystalline semiconductor structure, they are not suitable for use in thin film technology because hot electron injection cannot be used as a mechanism for data storage.

SUMMARY OF THE INVENTION

It is an aim of the present invention to provide a semiconductor memory device which can be fabricated in thin film technology.

According to one aspect of the present invention, there is provided a semiconductor memory device comprising an array of rows and columns of field effect transistors (FETs) providing memory locations for storing data, each FET having a conduction channel region extending between first and second main electrodes and a gate electrode for controlling conduction along the conduction channel region, and row and column conductors. The gate electrodes of the FETs in each row are connected to a respective row conductor and the first and second main electrodes of the FETs in each column are connected to respective adjacent column conductors so that the second main electrodes of the FETs in one column are connected to the first electrodes of the FETs in any adjacent column. The device also comprises circuitry for storing data at and reading data from the memory locations, such circuitry comprising means for storing data at a desired memory location by applying a first predetermined voltage to a selected row conductor and a second predetermined voltage to a selected column conductor, thereby establishing within each FET which has its gate electrode connected to the selected row conductor and one main electrode connected to the selected column conductor an electric field for causing a change in the current conduction characteristics of the part of its conduction channel region adjacent the selected column conductor when the difference between the first and second predetermined voltages exceeds a critical voltage. Thus, data is stored at the desired memory location formed by the respective part of the conduction channel region adjacent the selected column conductor of each FET connected to the selected column conductor.

In another aspect, the present invention provides a method of storing data in a semiconductor memory device comprising an array of rows and columns of field effect transistors (FETs) providing memory locations for data, each FET having a conduction channel region extending between first and second main electrodes and a gate electrode for controlling conduction along the conduction channel region, and row and column conductors. The gate electrodes of the FETs in each row are connected to a respective row conductor and the first and second main electrode of the FETs in each column are connected to respective adjacent column conductors so that the second main electrodes of the FETs in one column are connected to the first main electrodes of the FETs in any adjacent column. The method comprises applying a first predetermined voltage to a selected row conductor and a second predetermined voltage to a selected column conductor for establishing within each FET which has its gate electrode connected to the selected row conductor and one main electrode connected to the selected column conductor an electric field for causing a change in the current conduction characteristics of the part of its conduction channel region adjacent the selected column conductor when the difference between the first and second predetermined voltages exceeds a critical voltage. Data is thereby stored at the desired memory location which is provided by the respective part of the conduction channel region adjacent the selected column conductor of each FET connected to the selected column conductor.

Thus, in a semiconductor memory device and method in accordance with the invention data may be stored by application of first and second voltages to selected row and column conductors to subject any FETs connected to the selected row and column conductors to an electric field sufficient to cause a change in the current conduction characteristics (effectively due to a change in the threshold voltage) of the part of the FET's conduction channel region adjacent the selected column conductor.

Generally, except at the periphery of the device array, two transistors will be connected to the selected row and the selected column conductor which define a unique memory location so that each memory location is defined by part of the conduction channel region of each of two adjacent FETs with adjacent memory locations being defined by adjacent conduction channel parts. Any charge stored at this unique memory location will be detectable by virtue of the resulting change in the current conduction characteristics of the part of the conduction channel region of each of the two transistors adjacent the column conductor associated with that memory location.

Thus, apart from the peripheral FETs, each FET stores information relating to two different memory locations and thus stores two different pieces or bits of data. A semiconductor device and method in accordance with the present invention enables the two bits stored by a single FET to be uniquely accessed. Thus, the information is stored so as to be spatially separated, that is the change in threshold voltage, and thus the current conduction characteristics, only occurs in the area subject to the applied electric field which exists between the gate electrode and the selected one of the first and second main electrodes. In practice the electric field at the centre of the conduction channel region will be insufficient to result in a threshold voltage change, thus enabling the two bits to be spatially separated.

Preferably, a semiconductor memory device in accordance with the invention also comprises means for reading data from a desired memory location defined by a selected row and a selected column conductor by applying a third predetermined voltage to the selected row conductor and by applying predetermined voltages to the column conductors such that current flows through any FET connected to both the selected row and the selected column conductor in a direction in which the level of current flow is determined primarily by the current conduction characteristics of the part of the conduction channel region adjacent the selected column conductor, and detecting said current.

Data may thus be read by applying a third predetermined voltage to the selected row conductor and predetermined voltages to the column conductors so that any change in the current conduction characteristics due to data being stored at the desired memory location produces a detectable change in the current level.

The data reading means enables these two bits to be separately and uniquely identified.

Such a semiconductor memory device enables a virtual earth arrangement, which is very compact because it requires no separate earth electrode, to be used even when the array is formed in thin film technology and only one transistor is required per cell or memory location.

The means for storing data at a selected memory location may be arranged to apply the first and second predetermined voltage for sufficient time and to establish a sufficient electric field within each FET connected to both the selected row and the selected column conductor to cause the current conduction characteristics of the part of its conduction channel region adjacent the selected column conductor to be altered by state creation within the conduction channel region. Such a data storage process may only be reversed by annealing at high temperature (180° C. for an amorphous silicon thin film transistor array) and makes the memory device particularly suitable for use in a PROM (Programmable Read Only Memory).

In another arrangement, where the field effect transistors comprise insulated gate field effect transistors having a gate insulating region separating the gate electrode from the conduction channel region, the first and second predetermined voltages may be applied for sufficient time so as to establish a sufficient electric field within each FET connected to both the row and the selected column conductor to cause the current conduction characteristics to be adjusted by charge trapping within the gate insulating region. The use of such a method has the advantage that the process can be electrically reversed by applying a fifth predetermined voltage of opposite polarity to and of a magnitude greater than the critical voltage to one or more selected row conductors, thereby enabling data to be erased. This allows the formation of an electrically erasable and programmable ROM (EEPROM).

As indicated above, the field effect transistors may comprise thin film transistors and the means for reading data stored at a memory location may comprise means for applying a fourth predetermined voltage of the opposite polarity to the second predetermined voltage and to the selected column conductor so that the current flow is in opposite directions for reading and writing. In this example the fourth predetermined voltage applied to the selected column conductor provides the drain voltage for each TFT connected to the selected column conductor. The current through a TFT is more sensitive to changes in the current conduction characteristics adjacent the drain electrode than adjacent the source electrode because it is of course the drain end of the TFT which will pinch off at high drain bias. Accordingly, whether or not there has been a change in the conduction characteristics of the TFT's part defining a particular memory location can be uniquely determined by applying the fourth predetermined voltage to the selected column conductor associated with that memory location so that the TFT main electrodes connected to that column conductor form the drain electrodes, and then determining whether the current through the TFT at that memory location has changed, generally decreased, from what it would have been (in the absence of a change of the current conduction characteristics) by, for example, deriving a related voltage signal from the detected current and comparing it with a reference voltage.

A thin film transistor array for such a memory device may be manufactured by providing on an insulating substrate a first conductive layer divided into a first series of conductive strips for defining the gate electrodes integrally with the row electrodes, providing an insulating layer to cover the first series of conductive strips, providing a non-intentionally doped semiconductor layer on the insulating layer for defining the conduction channel regions of the thin film transistors, providing a photosensitive masking layer over the semiconductor layer, illuminating the photosensitive masking layer through the substrate, removing the unexposed areas of the photosensitive masking layer thereby exposing areas of the semiconductor layer, removing the exposed areas of the semiconductor layer so as to define, in alignment with the first series of conductive strips, semiconductor strips for forming conduction channel regions of the TFTs exposed areas and providing on the semiconductor layer a second conductive layer as a second series of strips extending transversely of the first series for defining the first and second main electrodes of the TFTs integrally with the column conductors. Such a method requires only two mask steps and does not involve any critical alignment procedures. This enables a high packing density to be achieved.

The second conductive layer may comprise a doped semiconductor layer covered by a layer of metal, such as aluminum.

The second series of strips may be provided after forming the conduction channel regions.

As an alternative, the second series of conductive strips may be provided on the semiconductor layer before providing the photosensitive masking layer over the semiconductor layer. This should avoid any possibility of contamination of the conduction channel regions by the photosensitive masking layer and also should allow all of the layers to be provided on the first series of conductive strips before any further masking steps are carried out, which should reduce processing time.

In another example, the transistors may comprise thin film field effect transistors (TFTs) having their gate electrodes on one side and their first and second main electrodes on the other side of the conduction channel region with the first and second main electrodes being isolated from but overlapping the conduction channel region. In such a case, the means for reading data stored at a memory location may comprise means for applying a fourth predetermined voltage of opposite polarity to the second predetermined voltage to the other one of the main electrodes of the FET to provide a current flow in the same direction to that which would be produced by the second predetermined voltage. In such a case, the two bits stored by each transistor can be uniquely detected by applying the fourth predetermined voltage to the column conductors so that the current flows in the same direction for both writing and reading, during reading as it would have been during application of the second predetermined voltage. In this example, the parasitic transistors inherent in the TFT structure because of the overlapping of the first and second main electrodes with the conduction channel region provide current paths in parallel with the main TFT conduction channel region and, by making the current flow in the same direction for both writing and reading, during the reading of data the parasitic transistor in parallel with the part of the TFT defining the desired memory location is switched off while the parasitic transistor in parallel with the other part of the same TFT is switched on or is conducting so providing a conduction path around the other part of the TFT so that the current detected is determined by the current conduction characteristic of the part of the TFT at the desired memory location, so that again unique detection of the data stored at a particular memory location is possible.

BRIEF DESCRIPTION OF THE DRAWING

Embodiments of the invention will now be described, by way of example, with reference to the accompanying drawings, in which.

DESCRIPTION OF THE PREFERRED EMBODIMENTS

Figure 1:
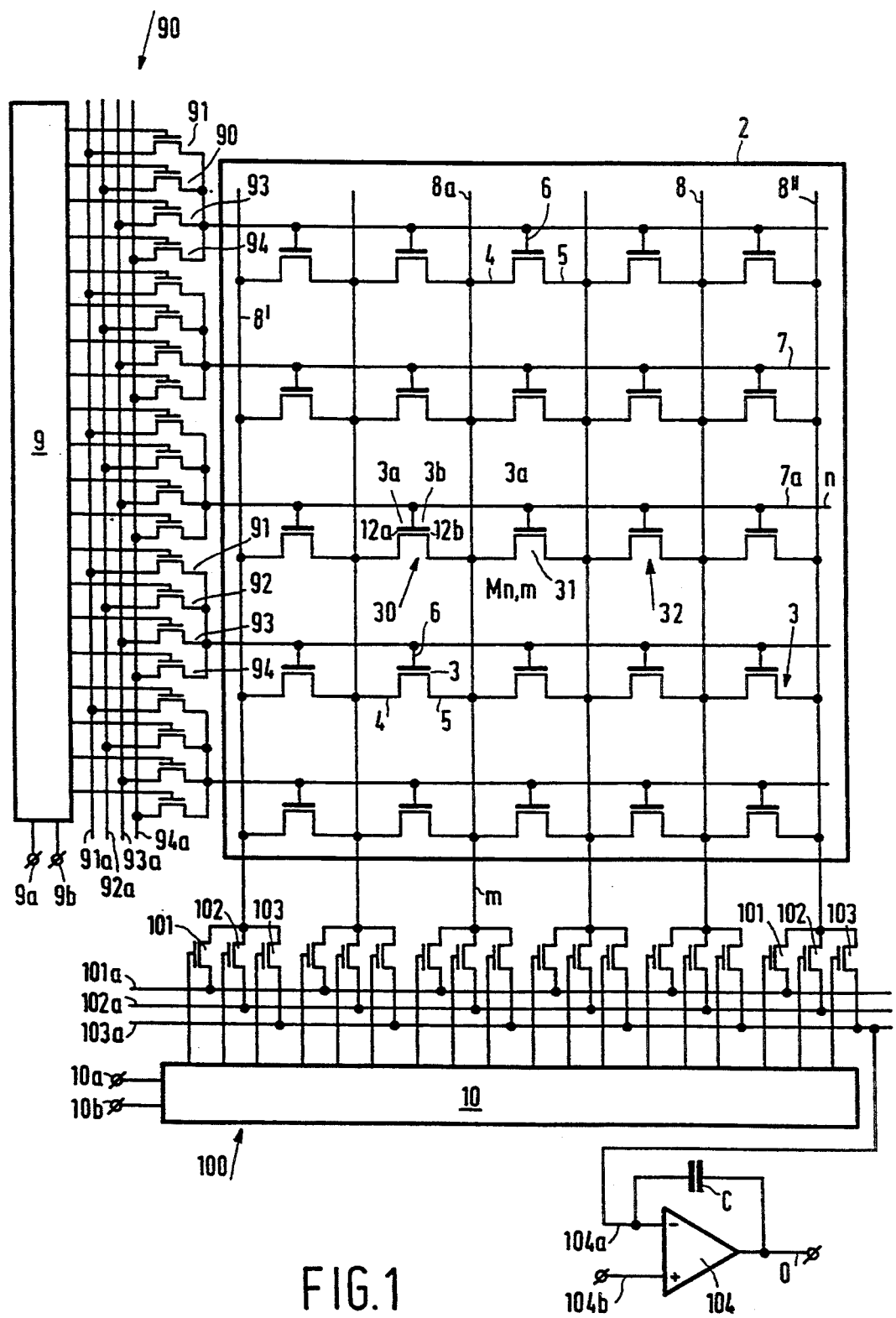
FIG. 1 is a schematic circuit layout showing part of a semiconductor memory device in accordance with the invention.

Referring now specifically to the drawings, FIG. 1 illustrates a circuit layout for a semiconductor memory device 1 in accordance with the invention.

As shown in FIG. 1, the semiconductor memory device comprises an array 2 of insulated gate field effect transistors (IGFETs), which in this example (as will be discussed in more detail below) are in the form of thin film field effect transistors (TFTs) 3.

The TFTs 3 each have first and second main electrodes (otherwise known as source and drain electrodes) 4 and 5 and a gate electrode 6. The TFTs 3 are arranged in rows and columns so that the gate electrodes 6 of the TFTs 3 in each row are connected to a respective row conductor 7 while the first and second main electrodes 4 and 5 of the TFTs 3 in each column are connected to respective adjacent column conductors 8 so that the second main electrodes 5 of the TFTs 3 in one column are connected to the first main electrodes 4 of the TFTs 3 in any adjacent column. This is a so-called virtual earth array (see, for example, U.S. Pat. No. 4,173,791) in which there is no separate earth connection. The row conductors 7 are connected to a row driving arrangement 90.

The row driving arrangement may be of any suitable form. FIG. 1 illustrates schematically one possible arrangement. In the example illustrated in FIG. 1, the row driving arrangement 90 comprises a shift register and decoder circuit 9 which has first and second inputs 9a and 9b for receiving clock and read, write or erase control signals. Each row conductor 7 is connected to one main electrode of each of a respective set of four insulated gate field effect transistors 91, 92 93 and 94 all of which have their gates individually connected to the shift register and decoder circuitry 9. The other main electrodes of the transistors 91, the transistors 92, the transistors 93 and the transistors 94 are connected to respective ones of first, second, third and fourth conductors 91a, 92a, 93a and 94a to which, as will be explained below, voltage signals are applied to enable writing, reading or erasing of data from the semiconductor memory device under the control of logical inputs to the shift register and decoder circuit 9.

The column conductors 8 are similarly connected to column driver arrangement 100 which again may be of any suitable form. In the example illustrated in FIG. 1, the column driver arrangement is similar to the row driver arrangement 90 and comprises a shift register and decoder circuit 10 which has first and second inputs 10a and 10b for controlling its operation.

Each column conductor 8 is connected to one main electrode of each of a respective set of three transistors 101, 102 and 103 each having their gate electrode individually connected to the shift register and decoder circuit 10. The other main electrodes of the transistors 101, the transistors 102 and the transistors 103 are connected to a fifth conductor 101a, a sixth conductor 102a and a seventh conductor 103a, respectively. The seventh conductor 103a is connected to a negative input 104a of a charge sensitive amplifier 104 while its positive input 104b and the fifth and sixth conductors 101a and 102a are connected, in operation, to voltages for enabling writing of data to and reading of data from the semiconductor memory device 1, as will be described below, under the control of a clock signal applied to the column shift register and decoder circuit 10. The charge sensitive amplifier 104 has its output O connected via a capacitor C to its negative input 104a and serves to convert a current supplied through an accessed column conductor into a voltage output which is compared with a reference voltage by a suitable conventional comparator (not shown) to determine the nature of the accessed data. The arrangement shown provides a serial data output although a parallel data output could be provided with appropriate circuitry.

It will be appreciated that although FIG. 1 shows only five row conductors 7 and six column conductors 8 connected to a 5×5 matrix array of TFTs 3, in practice the array may be much larger, and may be, for example, a 3000 by 3000 TFT array.

The row and column driver arrangements 90 and 100 may be formed on separate substrates from (or around the periphery of) the array 2 and may be, for example, in the form of polycrystalline silicon thin film transistor circuitry.

Figure 2:
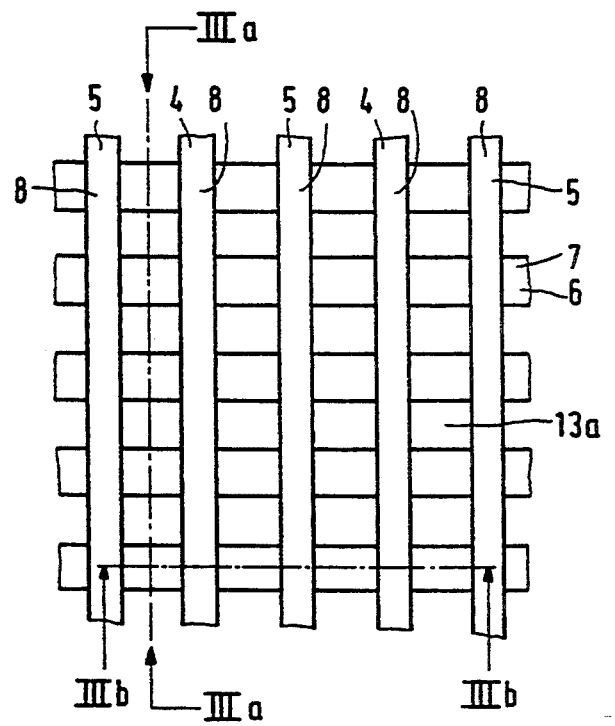
FIG. 2 is a top plan view of one example of an array of IGFETs for a semiconductor memory device in accordance with the invention.

As illustrated in FIGS. 2 and 3, the TFTs 3 forming the array 2 may have a particularly simple structure. Thus, the array 2 may be fabricated by first defining on an insulative substrate 11, which may be formed of glass or a suitable plastics material, a pattern of conductive, generally chromium, tracks which will form in an integral fashion the gate electrodes 6 and the respective row conductors 7 interconnecting the gate electrodes 6 of the TFTs of each row.

A thin insulating layer 12, for example, a layer of silicon nitride with a thickness of about 50 nm (nanometers), is then deposited to form the gate insulating regions of the TFTs followed by a layer 13 of an intrinsic amorphous semiconductor, in this case amorphous silicon, generally hydrogenated amorphous silicon, which forms the conduction channel regions of the TFTs 3. The insulating and semiconductor layers may be deposited by PECVD (plasma enhanced chemical vapour deposition). A layer of photosensitive resist is then deposited over the amorphous semiconductor layer 13 and exposed by back lighting through the substrate so that the areas of resist lying over the opaque chromium lines 7 are not exposed. The exposed areas of the resist are removed to leave a mask pattern 20. The exposed areas 13a of the underlying semiconductor are then etched away so that the partially remaining mesa-like strips 13b of amorphous semiconductor define conduction channel regions of the TFTs aligned with the chromium row conductors 7.

A layer of doped, in this example n conductivity type, amorphous semiconductor, again in this example hydrogenated amorphous silicon, is then deposited followed by a second metallisation level which may be formed of, for example, chromium or sequential layers of chromium and aluminium. The doped semiconductor and metallisation layers are then patterned to define strips extending transversely, as shown perpendicularly, of the row conductors 7.

As shown, the definition of the doped semiconductor and metallisation layers may etch the intrinsic amorphous silicon slightly so as to ensure isolation of adjacent first and second main electrodes.

Figure 3A:
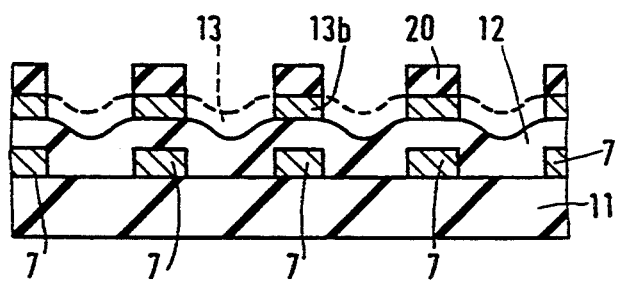
FIG. 3a is a cross-sectional view taken in the direction of the line IIIa—IIIa in FIG. 2 during the manufacture of the array shown in FIG. 2.
Figure 3B:
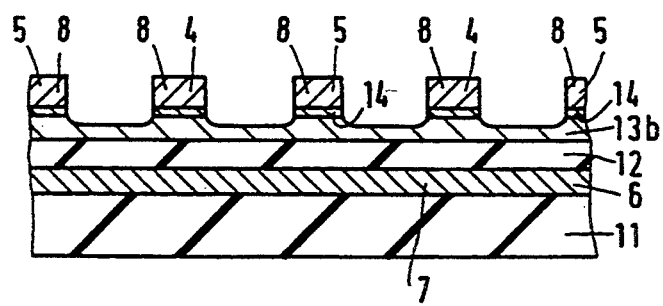
FIG. 3b is a cross-sectional view through part of the array shown in FIG. 2 taken along the line IIIb—IIIb in FIG. 2.

The steps of defining the conduction channel regions 13b by back illumination and defining the first and second main electrodes 4 and 5 may be reversed so that the column conductors 8 are first defined as shown in FIG. 3b and then the back illumination is carried out as illustrated in FIG. 3a to define the conduction channel region 13b. The reversal of these steps has the advantage of avoiding any possibility of contamination of the conduction channel region 13b by the photosensitive resist and also allows all the layers for forming the structure to be deposited onto the first series of conductive strips before any further masking steps are required.

The doped semiconductor regions 14 provide source and drain contact regions on the mesa-like strips 13b enabling the metallisation to make ohmic contact to the conduction channel regions. In a manner similar to the first series of conductive strips the second series of conductive strips defines in integral fashion the first and second main electrodes 4 and 5 of the TFTs 3 and the associated column conductors 8. The doped semiconductor regions 14 could be omitted so that the first and second main electrodes 4 and 5 contact the conduction channel regions 13b directly.

The drive circuitry (row and column decoder/addressing circuitry 9 and 10) may, as indicated above, be formed separately using known technology and interconnected with the array using known technology and will thus not be described further here.

This process is particularly simple requiring only two separate masks, and because there is no critical alignment between the two masks, an array of high density can be achieved. Thus, with present technology an array with a bit cell (TFT) size of about 15 $\mu$m by 15 $\mu$m (micrometers) should be possible allowing a capacity of about 10M bits (Megabits) for a finished device having a size comparable to a credit card taking into account the area occupied by the drive circuitry.

Figure 4:
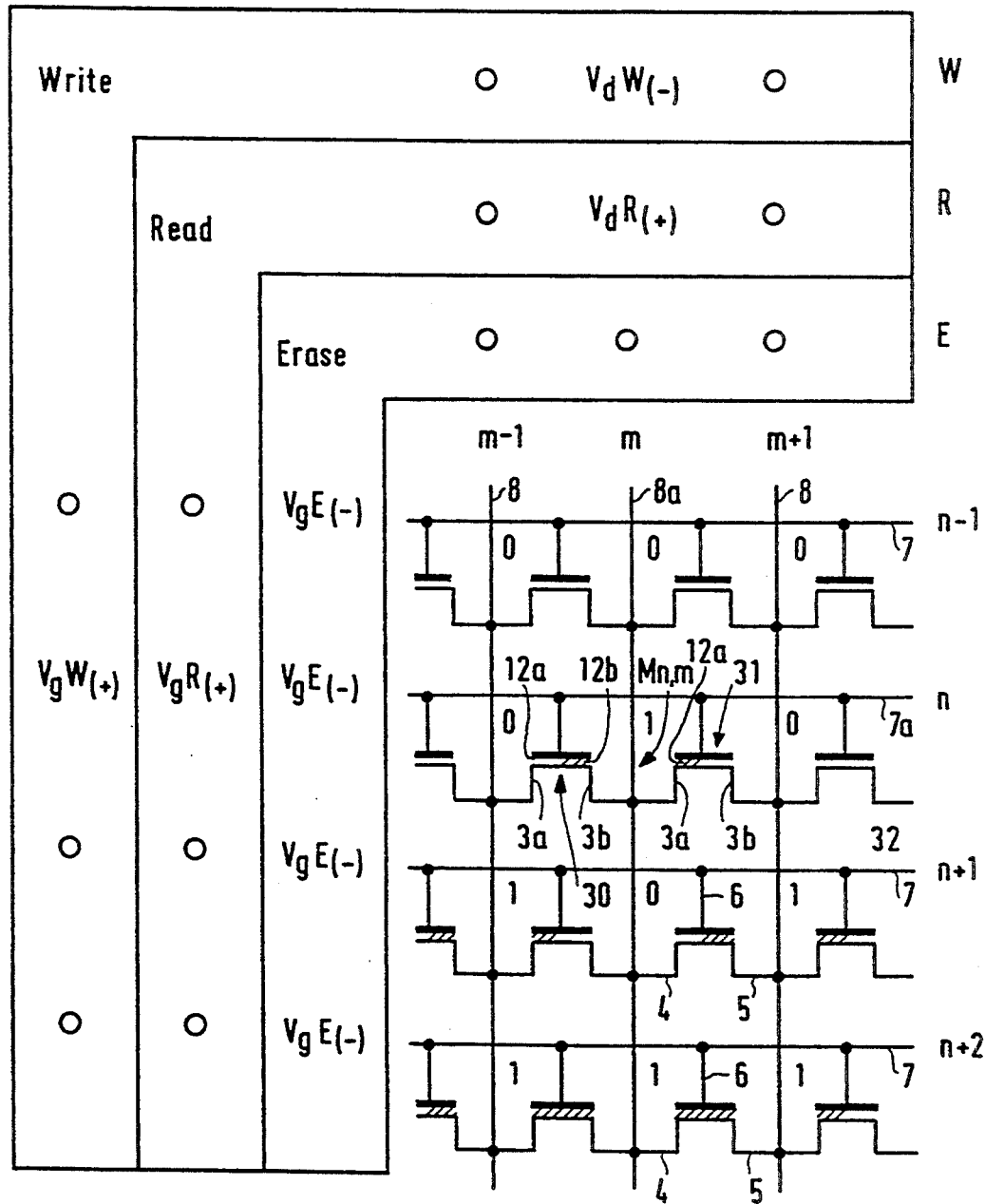
FIG. 4 is a schematic diagram for illustrating a method in accordance with the invention for writing data to and reading data from a selected IGFET of the array illustrated in FIGS. 2 and 3.

The array 2 of TFTs 3 provides memory locations M at which data can be stored and from which data can be read. As will become evident from the following description, each row conductor 7 forms with each column conductor 8 a unique memory location defined by the part 3a of one of the two TFTs 3 connected to that column conductor and that row conductor and the part 3b of the other of the two TFTs connected to the same row and column conductors. Thus, as shown in FIGS. 1 and 4, the nth row conductor 7a and mth column conductor 8a define the memory location $M_{n,m}$ which is provided by the part 3b of the TFT 30 and the part 3a of the TFT 31 adjacent the mth column conductor.

Whether a memory location $M_{x,y}$ stores data representing a logical '0' (zero) or a logical '1' (one) is determined by the current conduction characteristics of the TFT parts 3a and 3b providing the memory location.

The current conduction characteristics of a memory location M are determined by voltages applied to the row and column drive arrangements 90 and 100 as will be discussed in greater detail below.

In the examples to be discussed below, a memory location is caused to represent a logical 1 by applying, via the first and sixth conductors 91a and 102a and the appropriate transistors 91 and 102 first and second predetermined voltages $V_g^W(+)$ and $V_d^W(-)$ to the row and column conductors 7 and 8 associated with the selected memory location $M_{x,y}$ so as to establish a sufficiently high field within the respective parts 3a and 3b of the two TFTs connected to both the selected row conductor 7 and the selected column conductor 8 that charge trapping occurs within the gate insulating region thereby causing a change in the threshold voltage and thus causing a change in the current conduction characteristics of the respective parts 3a and 3b of the two TFTs. Where a memory location is to represent a logical '0' then, in this example, the first and second predetermined voltages $V_g^W(+)$ and $V_d^W(-)$ are not applied to the row and column conductor combination associated with that memory location.

Data stored at a given memory location can be read out by applying third and fourth predetermined voltages $V_g^R(+)$ and $V_d^R(+)$ to the appropriate row and column conductors 7 and 8 and detecting the current flow through the selected column conductor. The third predetermined voltage $V_g^R(+)$ is applied via the second conductor 92a and the appropriate transistor 92 selected via the row shift register and decoder circuit 9 while the fourth predetermined voltage $V_d^R(+)$ is applied to the positive input 104b of the charge sensitive amplifier 104a which has its negative input 104a connected to the seventh conductor 103a.

For reasons which will be explained below, in this case the selected column conductor forms the drain electrode of the two TFTs connected to both the selected row and the selected column conductor 7 and 8 so that the current flow through the TFTs is in the reverse direction to that for writing data to the memory location. This reversal of current flow is achieved in this example by making the fourth predetermined voltage $V_d^R(+)$ have the opposite polarity to the second predetermined voltage $V_d^W(-)$ (which is negative in this example) and by applying the second and fourth predetermined voltages $V_d^W(-)$ and $V_d^R(+)$ both to the selected column conductor.

As will become evident from the following description, this procedure enables data to be read from a unique memory location despite the fact that this memory location is defined by adjacent parts 3a and 3b of the two separate TFTs which are connected to the same row and column conductors 7 and 8 in the virtual earth arrangement.

FIG. 4 illustrates by means of a simple diagram the manner in which data is stored and read from TFTs of the array 2 shown in FIGS. 1 to 3.

In FIG. 4, part of the array 2 is shown surrounded by three right angled areas labelled W, R and E. The outer right angled area W gives the voltages applied by the row and column drivers 90 and 100 to the row conductors n−1,n,n+1,n+2 and column conductors m−1,m,m+1, respectively, during an operation to write, in this example, data representing a logical '1' at the memory location defined by the nth row and mth column conductors 7a and 8a to which the adjacent parts 3b and 3a of the TFTs 30 and 31 are connected while the intermediate right angled area R gives the voltages applied to the same row and column conductors 7a and 8a to enable reading of data stored at this memory location $M_{n,m}$. The inner right angled area E gives the voltages for erasing data.

In order to write data representing a logical '1' to the memory location $M_{n,m}$ at the intersection of the nth row and mth columns the row and column driver arrangements 90 and 100 ensure that all the row and column conductors 7 and 8 except the nth row and mth column conductors are at ground (earth) potential (which is illustrated in FIG. 4 as '0' (zero) volts) by rendering all the transistors 94, except the transistor 94 connected to the nth row conductor, conducting so as to connect the associated row conductors 7 to earth (ground) via the fourth conductor 94a and by rendering all the transistors 101, except the transistor 101 connected to the mth column conductor 8a, conducting to connect the associated column conductors 8 to ground via the fifth conductor 101a.

The transistor 91 connected to the nth row conductor 7a is rendered conducting by the row shift register and decoder circuit 9 to connect to the nth row conductor to a positive first predetermined voltage $V_g^W(+)$ via the first conductor 91a while the transistor 102 connected to the mth column conductor 8a is rendered conducting to connect the mth column conductor 8a to a negative second predetermined voltage $V_d^W(-)$. These two voltages are thus applied to the gates of the TFTs 30 and 31 and to the second main electrode 5 of the TFT 30 and the first main electrode 4 of the TFT 31, respectively.

The first and second predetermined voltages are selected such that the electric field established thereby within the part 3b of the TFT 30 and the part 3a of the TFT 31 is sufficient to cause charge to be trapped within the corresponding portions 12b and 12a of the gate insulating regions 12 of these two TFTs 30 and 31.

Figure 5:
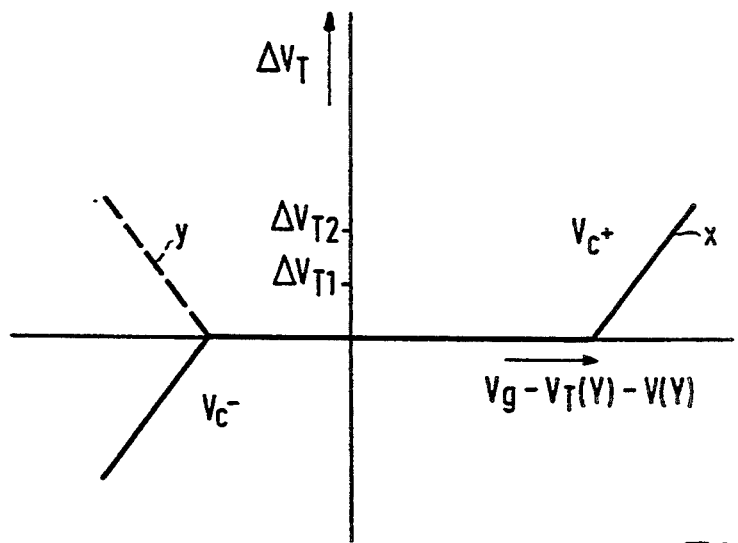
FIG. 5 illustrates graphically the change in threshold voltage as a function of the voltage applied across the gate insulating region of an IGFET of the array shown in FIGS. 2 and 3.

Charge trapping from the conduction channel region 13a into the gate insulating region 12 at a given position depends only on the electric field across the gate insulating region 12 at that particular position. The solid line curve X in FIG. 5 shows the change in the threshold voltage $\Delta V_T$ as a function of the potential (voltage) $V_g - V_T(y) - V(y)$ across the gate insulating region where Vg is the voltage applied to the gate electrode, V(y) is the conduction channel region potential at position y, $V_T(y)$ is the original unstressed threshold voltage at position y and $\Delta V_T$ denotes the threshold voltage change in the channel sheet conductance at position y. The charge Q(y) injected into the gate insulating region at position y is given by $Q(y) = C_{ins} \Delta V_T(y)$ where $C_{ins}$ is the geometrical capacitance of the gate insulating region. A memory effect is exhibited, that is there is a detectable change in the current conduction characteristics due to an effective change in the threshold voltage $\Delta V_T(y)$, and data is stored when the voltage across the gate insulating region exceeds a critical voltage $|Vc|$ (which may, as shown in FIG. 5, be negative $Vc(-)$ or positive $Vc(+)$).

It will of course be appreciated that FIG. 5 only illustrates a schematic curve X and that the precise relationship between the applied electric field and the change in threshold voltage $\Delta V_T(y)$ will depend upon factors such as material quality, duration of the writing voltages and the device temperature.

The first and second predetermined voltages are chosen such that $$V_g{}^W - V_d{}^W > Vc(+) \qquad (1)$$
$$V_g{}^W < Vc(+)$$
$$V_d{}^W < Vc(-)$$

that is such that the difference between the first and second predetermined voltages is greater than the positive critical voltage $Vc(+)$ at which the threshold voltage of the TFT begins to be altered, but the positive first predetermined or gate voltage $V_g{}^W(+)$ is itself less this critical voltage $Vc$ and the second predetermined or drain voltage $V_d{}^W(-)$ is itself greater (less negative) than the negative critical voltage $Vc(-)$ at which the threshold voltage begins to change. This means that the respective magnitudes of the first and second predetermined voltages are insufficient to induce a change in the threshold voltage but the difference between them is sufficient to generate a high enough field to induce charge trapping. It will of course be appreciated that to satisfy the conditions given above, the first and second predetermined voltages should be of opposite polarities so that as described above in the case of an n channel TFT, the first predetermined voltage $V_g{}^W(+)$ is positive while the second predetermined voltage $V_d{}^W(-)$ is negative.

The voltage across the gate insulating regions 12 of the TFTs 30 and 31 will only be sufficient to result in charge trapping in the portions 12a and 12b of the gate insulating regions adjacent the main electrode to which the second predetermined voltage $V_d{}^W(-)$ is applied, that is adjacent the second main electrode 5 of the TFT 30 and adjacent the first main electrode 4 of the TFT 31. Thus only the part 3a of the TFT 30 and the part 3a of the TFT 31 are sufficiently stressed by the application of the first and second predetermined voltages $V_g{}^W(+)$ and $V_d{}^W(-)$ to the selected row and column conductors 7a and 8a, respectively, to cause an effect on the threshold voltage and thus on the current conduction characteristics. Therefore, as illustrated schematically in FIG. 4, the data for the memory location Mn,m of the array is represented by charge stored at (as viewed in FIG. 4) the right hand portion 12b of the gate insulating region of TFT 30 and at the left hand portion 12a of the gate insulating region of TFT 31. This stored charge is illustrated in FIG. 4 by hatching. The part 3a of the TFT 30 and the part 3b of the TFT 31 remote from the mth column conductor 8a are unstressed. Indeed, as should be evident to the skilled reader, the part 3a of the TFT 30 defines with the part 3b of the adjacent TFT (not shown in FIG. 4) connected to the nth row conductor 7a and the (m−1)th column conductor the memory location $M_{n,m-1}$ while the part 3b of the TFT 31 defines with the part 3a of the adjacent TFT 32 the memory location $M_{n,m+1}$.

The above described procedure can be repeated for other rows and columns enabling data to be stored at each memory location M of the array 2.

FIG. 4 shows a binary pattern

| FIG. 4 shows a binary pattern | | | |
|---|---|---|---|
| | m − 1 | m | m + 1 |
| n − 1 | 0 | 0 | 0 |
| n | 0 | 1 | 0 |
| n + 1 | 1 | 0 | 1 |
| n + 2 | 1 | 1 | 1 | as having been stored at the part of the array represented therein.

In order to read the status of a memory location, for example, the memory location $M_{n,m}$ as shown in FIG. 4, all the row and column conductors except the nth row conductor 7a and the mth column conductor 8a are connected to ground as described above in relation to the writing operation.

A positive third predetermined voltage $V_g{}^R(+)$ is applied to the nth row conductor 7a via the second conductor 92a and the transistor 92 associated with the nth row conductor 7a while a positive fourth predetermined voltage $V_d{}^R(+)$ is applied to the positive input 104b of the charge sensitive amplifier 104 whose negative input 104a is connected via the seventh conductor 103a and the appropriate transistor 103 to the mth column conductor 8a thereby holding the mth column conductor at the fourth predetermined voltage.

The positive fourth predetermined voltage $V_d{}^R(+)$ provides the drain voltage for the two TFTs 30 and 31 connected to the selected column conductor 8a and the current flow is in the opposite direction to that during writing because the second and fourth predetermined voltages are of opposite polarity.

The current through a TFT is more sensitive to change in the threshold voltage and thus current conduction characteristics adjacent the drain electrode than adjacent the source electrode because, of course, pinch-off will occur at the drain end under high drain bias. Accordingly a change in the threshold voltage at the part of a TFT adjacent its drain electrode will have considerably more effect on the current conduction characteristics than would a change in the threshold voltage at the part of a TFT adjacent its source electrode. Accordingly, whether or not charge has been stored at a memory location $M_{m,n}$ (in this example) defined by adjacent parts 3b and 3a of two adjacent TFTs 30 and 31 can be uniquely determined by making their shared main electrode the drain electrode of each TFT by applying the fourth predetermined voltage $V_d{}^R(+)$ to the selected column conductor 8a and detecting any decrease in current. The detection of such a decrease in current will, in this example, indicate that charge representing a logical '1' has been stored at the memory location $M_{m,n}$. The current flowing through the selected column conductor 8a is detected by the charge sensitive amplifier 104 and converted to a voltage which is then compared, using a conventional comparator (not shown), with a reference voltage to determine whether the selected memory location $M_{m,n}$ is storing a logical '0' (substantially no change) or a logical '1' (a significant current change).

The third and fourth predetermined voltages should of course be such that the electric fields induced within the TFTs connected to the selected row and column conductors are insufficient to cause a threshold voltage change, that is such that no stressing takes place. This requires that the third and fourth predetermined voltages $V_g^R(+)$ and $V_d^R(-)$ each have a magnitude less than the critical voltage Vc and that the magnitude of the difference between the third and fourth predetermined voltages similarly be less than the critical voltage.

The level of current detected indicates whether a particular memory location stores data representing, for example, a logical '1' or whether no charge is stored at that memory location so that the memory location "stores" data representing a logical '0'. Thus, those parts of the two TFTs representing a memory location, for example the parts 3b and 3a of the TFTs 30 and 31 representing the memory location $M_{n,m}$ mentioned above, at which charge has been stored (i.e. those representing, in this case, a logical '1') by inducing a sufficiently high electric field to cause charge trapping within the portions 12b and 12a of the gate insulating regions of the TFTs 30 and 31 during the writing operation will have a threshold voltage of greater magnitude than the parts of the TFTs at which no charge has been stored (i.e. those representing a logical '0') and so for fixed values of the third and fourth predetermined voltages $V_g^R$ and $V_d^R$, the current flowing through the two TFT parts 3a and 3b of the two TFTs of a memory location at which charge has been stored to represent a logical '1' will be less than that flowing through the corresponding TFT parts of a memory location (e.g. $M_{n,m+1}$) at which no charge has been stored. These two levels of current can be detected and distinguished as discussed above or by using any suitable conventional means.

As will be appreciated from the above, each bit is stored at a memory location $M_{x,y}$ (where $x=1, \ldots, n-1, n, n+1 \ldots$ and $y=1, \ldots, m-1, m, m+1, \ldots$) represented by adjacent parts, generally halves, 12a, 12b of the gate insulating regions of two adjacent TFTs so that each TFT stores information representing two different bits.

It will of course be appreciated that the first and last column conductors (8' and 8" in FIG. 1) will each be connected to only one column of TFTs 3 so that the memory locations defined by these column conductors 8' and 8" and any of the row conductors 7 will only consist of part (3a in the case of the column conductor 8' and 3b in the case of the column conductor 8") of a TFT and so the charge stored at such memory locations will be proprortionally less. This could be accommodated by incorporating additional circuitry, for example, current mirror arrangements, to scale the current through the column conductors 8' and 8" to be equivalent to that through the other column conductors. Alternatively, the first and last column conductors could merely be dummy conductors which are not in practice used to define memory locations.

As indicated in FIG. 4, each TFT 3 is thus used to represent two different bits with the charge representing one bit being stored by the adjacent parts 12a, 12b of the gate insulating region of two adjacent TFTs 3 in the same row and connected to the same column conductor. Although it might appear that charge stored on two parts 12a and 12b of the gate insulating region of the same TFT could not be differentiated, this is not the case in practice. Thus, the writing operation described above causes any charge packets stored by a single TFT 3 to be spatially separated so as to be located at opposite ends of the conduction channel region and the reversal of polarity between the second and fourth predetermined voltages $V_d^W$ and $V_d^R$ enables each of these charge packets to be detected independently. Thus, as discussed above, at high drain bias the current through a TFT shows a larger decrease due to charges stored near the electrode that acts as the drain of the TFT than due to charges stored near the electrode that acts as the source and by reversing the polarity of the voltage between the two main electrodes of the two TFTs, that is by reversing the polarity between the column conductors to which the TFTs representing a memory location are connected, the parts 3a, 3b at which the charge was stored can be determined uniquely by detecting whether the current increases or decreases.

The above-described writing and reading operations have been simulated for a TFT having idealised charge trapping characteristics and for which the following characteristics were used.

Figure 6:
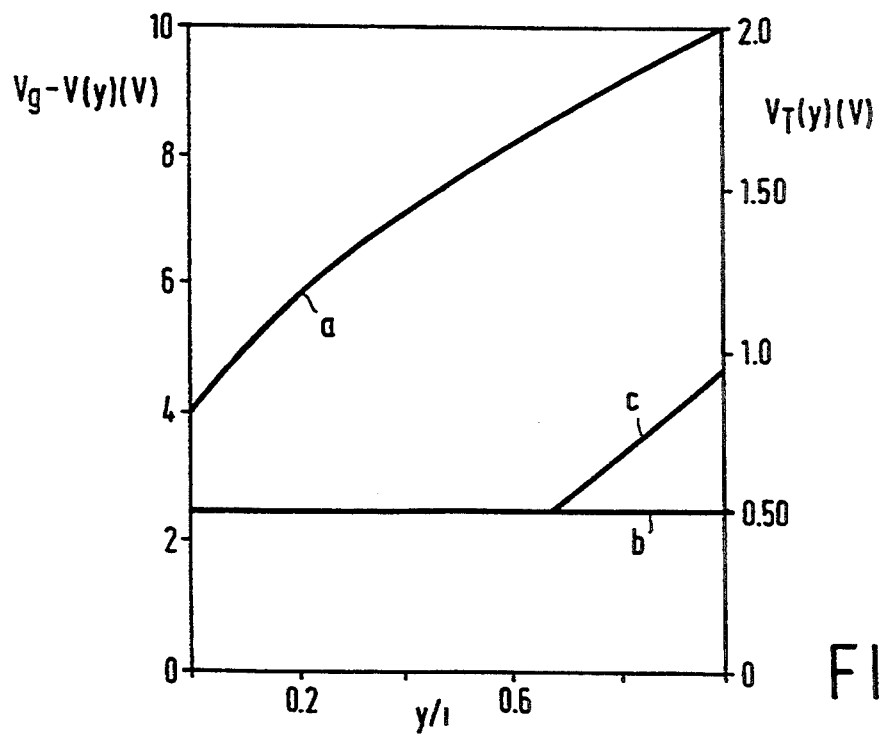
FIG. 6 illustrates graphically the change in threshold voltage across the conduction channel region of a TFT as shown in FIG. 3 as a result of charge trapping within the gate insulating region.

Gate insulating region thickness $d_{sin} = 50$ nm
conduction channel width to length ratio $W/l = 1$ μm
mobility $\mu = 0.4$ cm$^2$V$^{-1}$S$^{-1}$
decades of current per volt $S = 10/V$
critical voltage $Vc(+) = 8$ volts
$\alpha \Delta VT/dVg = 0.3$
first predetermined voltage $V_g^W = 4$ volts
second predetermined voltage $V_d^W = -6$ volts
third predetermined voltage $V_g^R = 4$ volts
fourth predetermined voltage $V_d^R = 4$ volts FIG. 6 illustrates the writing operation showing by curve a with respect to the left hand axis the relationship between the voltage $Vg-V(y)$ across the gate insulating region and the position y along the conduction channel region, where $y=0$ is adjacent one main electrode 4 and $y=1$ is adjacent the other main electrode 5 of the TFT, with the second predetermined voltage $V_d^W(-)$ being applied to the other main electrode 5. Curves b and c are drawn with respect to the right hand axis and represent the relationship between the threshold voltage $V_T(y)$ and the position y along the conduction channel region before and after, respectively, data has been stored at a memory location represented by the part of the conduction channel region of the TFT adjacent the main electrode 5 by charge trapping induced by the electric field applied across the TFT.

As shown in FIG. 6 by curve c, during the writing operation the voltage across the gate insulating region increases from left to right (i.e. from the end of the conduction channel region closest to the 'source' electrode 4 to the end closest to the 'drain' electrode 5) because of the negative second predetermined voltage $V_d^W(-)$ applied to the 'drain' electrode 5. At a distance of about 0.61 (where 1 is the channel length) from the source electrode the critical voltage $V_c$ is achieved and c the threshold voltage alters because of the charge trapping induced in the gate insulating region.

Data or charge is thus stored in the part 12a or 12b of the gate insulating region 12 of this TFT adjacent the 'drain' electrode 5 (and of course also in the part 12b or 12a of the gate insulating region 12 of the adjacent TFT connected to the same row and column conductors).

Figure 7:
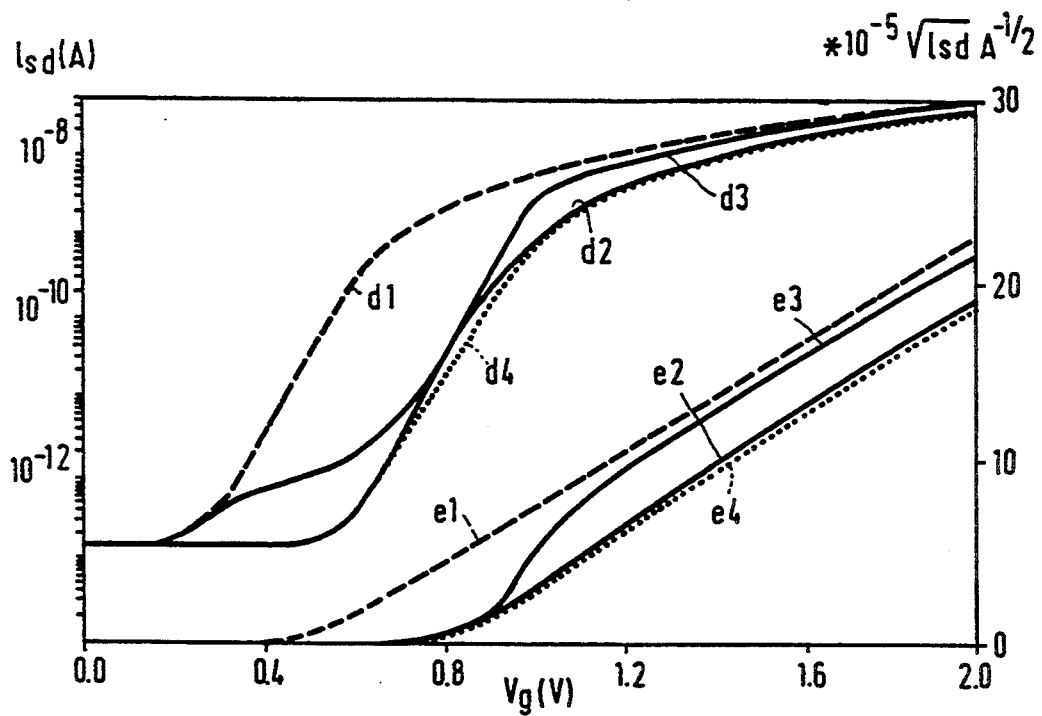
FIG. 7 illustrates the modelled transfer characteristics of a TFT of the array shown in FIGS. 2 and 3 before and after writing of data to the TFT.

To illustrate the reading operation, FIG. 7 shows the transfer characteristics (current Id versus gate voltage Vg) of the modelled transistor with curves $d_1$ to $d_4$ being referenced to the logarithmic Isd left hand scale and curves $e_1$ to $e_4$ to the $\sqrt{Isd}$ right hand scale.

The dashed curves $d_1$ and $e_1$ represent the characteristic before the writing operation. In this circumstance it does not matter which of the first and second main electrodes 4 and 5 forms the drain electrode because the device is symmetric.

The solid lines $d_2$, $d_3$, $e_2$ and $e_3$ indicate the characteristic after a writing operation. In the case of curves $d_2$ and $e_2$ the fourth predetermined voltage $V_d^R$ (which is of opposite polarity to the second predetermined voltage $V_d^W$) is applied to the same one 5 of the two main electrodes as the second predetermined voltage $V_d^W(-)$ whereas in the case of curves $d_3$ and $e_3$ the fourth predetermined voltage $V_d^R$ is applied to the other one 4 of the two main electrodes. As can be seen from FIG. 7 the current above the threshold voltage is significantly lower in respect of curves $d_2$ and $e_2$ than the curves $d_3$ and $e_3$ giving a correct indication that charge has been stored adjacent the one electrode 5 but not adjacent the other main electrode 4. The dotted curves $d_4$ and $e_4$ illustrate the situation where charge is stored on both halves of the TFT and so the device is once again symmetrical.

Figure 8:
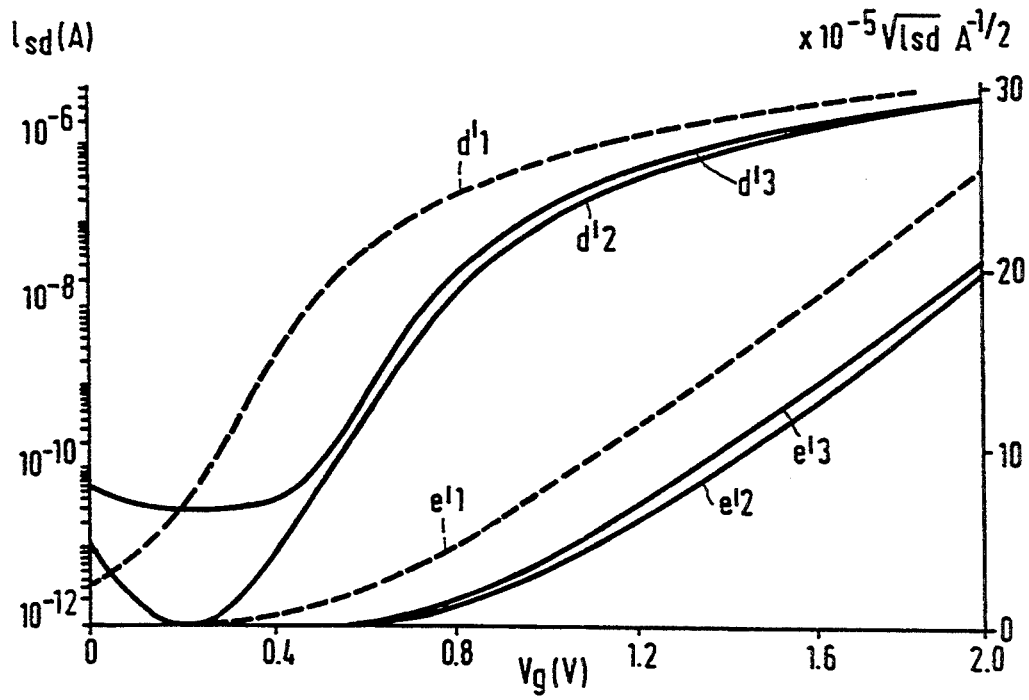
FIG. 8 illustrates experimentally obtained transfer characteristics of a TFT of the array shown in FIGS. 2 and 3 before and after writing of data of the TFT.

For comparison purposes FIG. 8 illustrates, on the basis of a graph similar to FIG. 7, experimentally obtained transfer characteristics $d'_1$, $d'_2$, $d'_3$ and $e'_1$, $e'_2$, $e'_3$ equivalent to those modelled in FIG. 7 where the first and second predetermined voltages $V_g^w(+)$ and $V_d^w(-)$ were 4 and $-6$ volts, respectively, and were applied for a period of 10 seconds to a TFT similar to those shown in FIG. 3 with a gate insulating region thickness of 50 nm and a conduction channel region width to length w/l ratio of 138. Again storage of charge at one half and not at the other half of the TFT can easily be identified.

The contents of the semiconductor memory device 1 can be completely erased, as shown in FIG. 4 by means of the right angled area or box labelled E, by grounding all the column conductors 8 as described above and applying, via the transistor 93 and the third conductor 93a, a negative reset voltage $V_g^E = Vd(-) + V_T$ (where $V_T$ is the unstressed nominal threshold voltage of the TFTs) to all the row conductors 7. Alternatively a row-by-row erasing operation is possible if all the row conductors except that of the row to be erased are grounded and the reset voltage is merely applied to the row conductor associated with the row to be erased.

The present invention may be applied to TFT arrays 2 having TFTs of different structure from that shown in FIGS. 2 and 3. The TFTs may have any of the conventional forms, for example, coplanar, staggered, inverted coplanar or inverted staggered forms.

Figure 9:
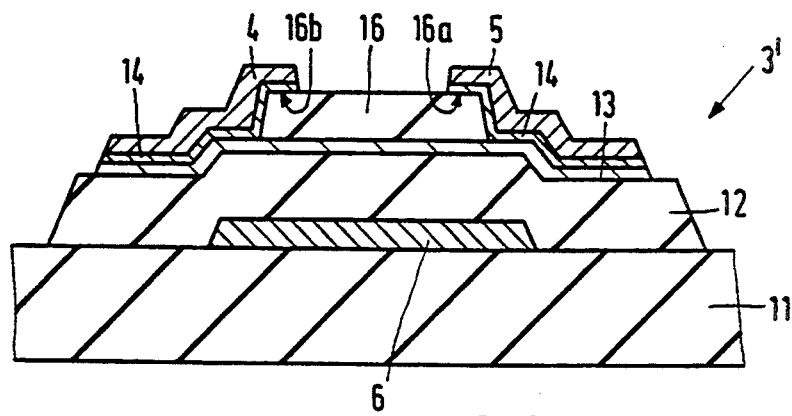
FIG. 9 is a cross-sectional view through another type of TFT suitable for use in a semiconductor memory device in accordance with the invention.

FIG. 9 is a schematic cross-section through an inverted staggered TFT 3' of the so-called type B form which may be used in a semiconductor memory device in accordance with the invention, As shown in FIG. 9, the gate electrode 6 provided on the insulative substrate 11 is covered by the gate insulating region 12, which again may be formed of silicon nitride and an intrinsic semiconductor layer for forming the conduction channel region 13. Again the intrinsic semiconductor layer may be formed of hydrogenated amorphous silicon. In this structure a passivating region 16, for example formed of silicon nitride, is provided over the conduction channel region 13 before the source and drain contact regions 14 and electrodes 4 and 5 are formed. The source and drain electrodes 4 and 5 thus overlap slightly with the passivating region 16 which may result in parasitic transistors in the overlap regions 16a and 16b with the passivating layer 16 forming the gate insulating region of the overlap parasitic transistors.

Figure 10:
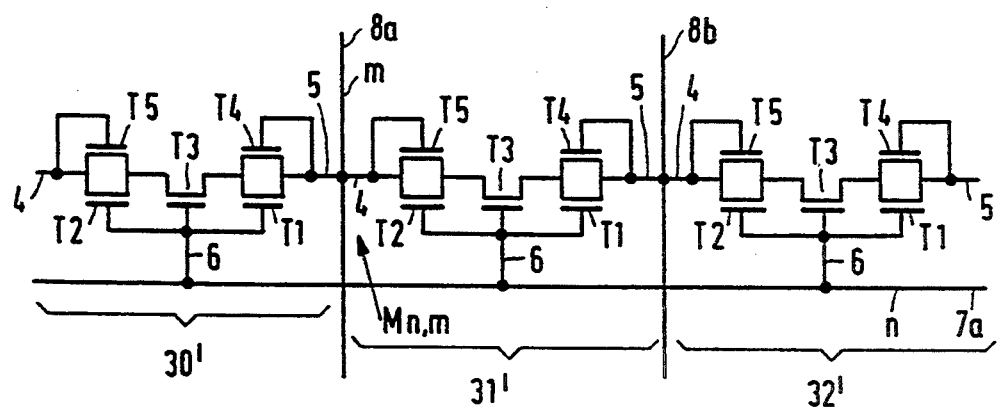
FIG. 10 is an equivalent circuit for three adjacent TFTs of the type shown in FIG. 9.

FIG. 10 shows an equivalent circuit for three adjacent TFTs 30', 31' and 32' of the type shown in FIG. 9 in which transistors T4 and T5 represent the overlap parasitic transistors while transistors T1, T2 and T3 represent the main conduction channel region 13 TFT with transistors T1 and T2 representing the portions of the main transistor beneath the overlap regions 16a and 16b, respectively. The three TFTs 30', 31' and 32' are all in a single row, say row n, of the 2-D matrix array of a semiconductor memory device in accordance with the invention having the circuit layout shown in FIG. 1. In order to store data at the memory location $M_{m,n}$ which is defined by part of the TFT 30' and part of the TFT 31' the first and second predetermined voltage $V_g^W(+)$ and $V^{dW}(-)$ are applied to the appropriate nth row and mth column conductors 7a and 8a, respectively as described above with reference to FIG. 4 with $V_g^W - V_d^W/2$ about equal to or close to the critical voltage Vc(+) above which charge trapping occurs in the gate insulating region. Charge will therefore be trapped in the part of the gate insulating region adjacent the overlap region 16a of the TFT 30' so stressing its transistor T1 and causing a change in its threshold voltage. Charge will also be trapped in the part of the gate insulating region adjacent the overlap region 16b of the TFT 31' so stressing its transistor T2 and causing a charge in its threshold voltage. As discussed above the trapped charge can be sensed as a decrease in current to provide an indication that data, e.g. a logical 1, has been stored at the memory location $M_{n,m}$ or data point represented by the intersection of the nth row and mth column conductor.

In order to explain how data is read from a semiconductor memory device having an array formed of the type of transistor shown in FIG. 9, reference will first be made to a single TFT, in this case the TFT 31' in which the transistor 72 has been stressed by the application, as described above, of the write voltages via the nth row and mth column conductors 7a and 8a.

If, during reading, the third predetermined voltage $V_g^R$ is applied to the nth row conductor 7a and the positive fourth predetermined voltage $V_d^R$ is applied to the m+1th column conductor 8b, then, considering only the TFT 31', the transistor T5 will be off and the transistor T4 will be on so that the transistor T1 (and any charge stored thereat) is bypassed and only the charge stored at the transistor T2 is sensed. If the fourth predetermined voltage had been applied to the mth column conductor 8a then, again considering only the TFT 31', the transistor T5 would be on so bypassing the transistor T2 while the transistor T4 would be off enabling any charge stored at the transistor T1 to be sensed. Accordingly charge trapped at opposite ends (at the transistors T1 and T2 in equivalent circuit terms) can be separately sensed and uniquely detected enabling, as discussed above, each TFT 3' to store data representing two different bits.

It will be appreciated from the above that, in order to read data from a memory location, in this example the memory location $M_{n,m}$, of a semiconductor memory device in accordance with the invention having TFT's with a structure similar to that shown in FIG. 9, the mth column conductor 8a from which the data is to be read should be at a potential which is negative with respect to the adjacent (m−1 and m+1) column conductors.

Thus, in the example given above, the mth column conductor 8a may be at ground while the remaining column conductors are at the positive fourth predetermined voltage $V_d^R$. The row and column drive arrangements 90 and 100 may be similar to those shown in FIG. 1 with, of course, suitable modification of the control or logic inputs to enable the appropriate voltages to the applied.

It will be appreciated from the above that the operation of a semiconductor memory device using the type of TFT 3' shown in FIG. 9 differs from the operation of a semiconductor memory device using the type of transistor shown in FIGS. 2 and 3 by virtue of the fact that in the former case, that is with so-called type B TFT 3', the direction of current flow through the TFT is the same for both reading and writing of data to a specific memory location, while for the TFT 3 shown in FIGS. 2 and 3 the direction of current flow is reversed between writing and reading operations.

Also, although in the example described with reference to FIGS. 2 to 4, the second and fourth predetermined voltages $V_d^W(-)$ and $V_d^R(+)$ are of opposite polarity and applied to the same mth column conductor 8a so as to achieve current flow in opposite directions during writing and reading, provided that the difference between the third and fourth predetermined voltages does not reach the critical voltage, the same reversal of polarity could be achieved by using fourth and second predetermined voltages of the same polarity and grounding the mth column conductor 8a while applying the fourth predetermined voltage to the remaining column conductors. Similarly, in the FIGS. 9 and 10 example, the second and fourth predetermined voltages $V_d^W$ and $V_d^R$ may be of the same polarity and applied to the same column conductor 8a with the others grounded so that current flow is in the same direction for reading and writing. Again, care would be needed to ensure that the critical voltage is not reached during the reading operation.

Figure 11:
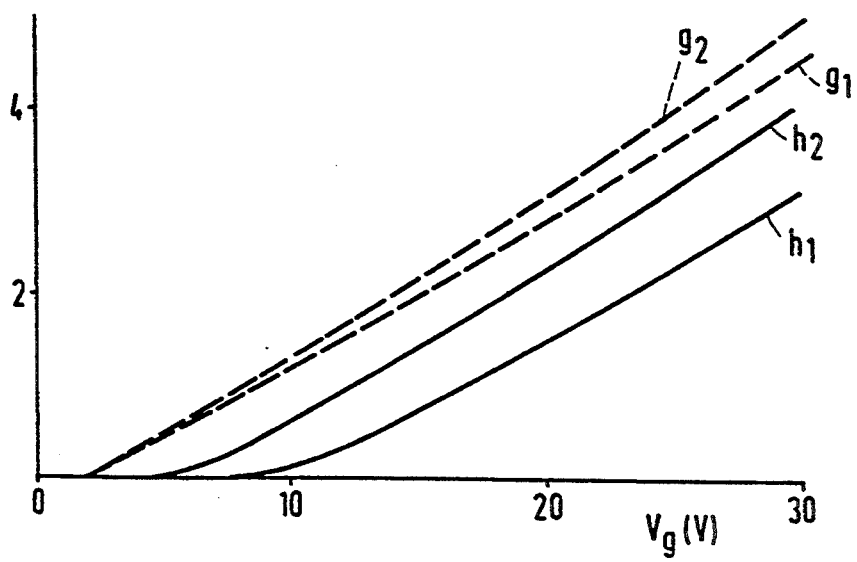
FIG. 11 illustrates experimental transfer characteristics obtained for the TFT shown in FIG. 9.

FIG. 11 illustrates graphically experimental transfer characteristics (square root of the source drain current against gate voltage) obtained for a TFT 3' of the type shown in FIG. 9 where the TFT 3' has a gate insulating region thickness of 400 nm and a conduction channel width to length W/l ratio of 5.07 to which a first predetermined voltage $V_g^W$ of 40 volts and a second predetermined voltage $V_d^W$ of $-30$ V were applied for 1000 seconds. In this example the second predetermined voltage was applied to the main electrode 4. The dashed lines g1 and g2 illustrate the transfer characteristic without application of the first and second predetermined voltages $V_g^W$ and $V_d^W$, with the dashed line g1 representing the characteristic obtained with the fourth predetermined voltage $V_d^R$ applied to the other main electrode 5 and the dashed line g2 representing the characteristic obtained with the fourth predetermined voltage $V_d^R$ applied to the same main electrode 4.

The solid lines h1 and h2 show analogous curves for the situation after the application of the first and second predetermined voltages with h1 showing the curve for the fourth predetermined voltage $V_d^R$ of $+30$ V applied to the other main electrode 5 and h2 with the fourth predetermined voltage applied to the same electrode 4. The third predetermined reading gate voltage $V_g^R$ is the same as the first voltage $V_g^W$. As is clear from FIG. 11, the charge stored adjacent the transistor T2 can be uniquely determined.

The present invention has been described above with reference to the use of charge trapping within the gate insulating region as the mechanism for enabling data storage within the array 2. However charge trapping is only one of two possible mechanisms which may be taken advantage of. Thus, the threshold voltage shift induced by the electrical field applied by the first and second predetermined voltages may be derived either as a result of charge trapping in the gate insulating region as discussed above or as a result of the creation of states within the conduction channel region. These two mechanisms have different bias, time and temperature dependencies as discussed in, for example, the following papers Powell M. J., van Berkel C, French I. D. and Nicholls D. H.; "Bias Dependence of Instability Mechanisms in Amorphous Silicon Thin Film Transistors", published in Applied Physics Letters, Vol. 51, page 1242 (1989) and Powell M. J., van Berkel C and Hughes J. R.; "Time and Temperature Dependence of Instability Mechanisms in Amorphous Silicon Thin Film Transistors", published in Applied Physics Letters, Vol. 54, page 1323 (1989).

At room temperature and moderately long stressing times (for example, 1000 sec), state creation dominates at lower biases (that is at voltages having a magnitude less than that required to enable charge trapping) while charge trapping takes over at higher bias. State creation is a relatively slow process at room temperature, but strongly increases with increasing temperature. Charge trapping is faster at short times than state creation; it is also temperature independent.

The important difference between the two mechanisms for the purposes of this invention is that, as discussed above, charge trapping can be reversed by application of a sufficiently strong bias of opposite polarity while the state creation takes place at both positive and negative bias stress (albeit at different energy positions within the band gap) as indicated by the dashed line Y in FIG. 5. State creation can only be reversed by annealing at temperatures larger than 180° C. Accordingly, the present invention may be used to provide an electrically programmable and erasable read only memory (EEPROM) by selecting the voltages and duration of the first and second predetermined voltages $V_g^R$ and $V_d^R$ such that the resultant threshold voltage shift $\Delta V_T$ is due to charge trapping or to provide a programmable read only memory PROM) whose contents can only be changed by annealing at high temperature by selecting the first and second predetermined voltages such that charge in current conductive characteristics is because the threshold voltage shift is due to state creation.

Although in the examples described above, the semiconductor memory device is a digital device storing charge representing either a logical '0' or a logical '1', it would be possible for the semiconductor memory device in accordance with the invention to store data representing more than two different levels by selecting different values of threshold voltage change to represent different data levels. Thus, referring to FIG. 5, a threshold voltage change below a first value $\Delta VT1$ would be taken to represent a first data value, for example 1, a threshold voltage change in the range between $\Delta VT1$ and $\Delta VT2$ could be taken to represent a second data value, for example 2, and so on.

It will also be appreciated that although the presence of charge has been taken to the above examples to represent a logical '1' and the absence of charge has been taken to represent a logical '0', these designations could be reversed.

Although the above-described examples use n-channel TFTs the present invention could possibly be applied to p-channel devices with appropriate modification of voltage polarities etc.

Although the above-described examples relate to semiconductor memory devices manufactured using thin film technology, the present invention could be applied to other semiconductor technologies, for example, the so-called SOI (silicon on insulator) technology in which crystalline silicon is provided on an insulating layer or region or to bulk single crystal semiconductors, for example, silicon, technologies where the IFETs are in the form of MNOS transistors, that is where the gate insulating region is formed by a nitride/oxide combination, or other suitable charge trapping combination. Also, semiconductor materials other than silicon could be used. However, the present invention has particular advantages when applied to thin film technology because the normal mechanism used for data storage in bulk semiconductor IGFETs, namely hot electron injection, is not practical. Furthermore, the present invention is particularly suited to an inverted staggered TFT technology because both the gate insulating region and the conduction channel region can be readily defined by the gate electrode pattern as discussed above with reference to FIGS. 2 and 3.

From reading the present disclosure, other modifications and variations will be apparent to persons skilled in the art. Such modifications and variations may involve other features which are already knoll in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention.

We claim:

1. A semiconductor memory device comprising an array of rows and columns of field effect transistors (FETs) providing memory locations for storing data, each FET having a conduction channel region extending between first and second main electrodes and a gate electrode for controlling conduction along the conduction channel region, an array of row and column conductors, the gate electrodes of the FETs in each row being connected to a respective row conductor and the first and second main electrodes of the FETs in each column being connected to respective adjacent column conductors so that the second main electrodes of the FETs in one column are connected to the first electrodes of the FETs in an adjacent column whereby said memory locations are defined by a respective unique pair of row and column conductors, and circuitry for storing data at and reading data from the memory locations, the circuitry for storing data at a desired memory location defined by a pair of selected row and column conductors, means for applying a first predetermined voltage to a selected row conductor and a second predetermined voltage to a selected column conductor for establishing within each FET which has its gate electrode connected to the selected row conductor and one main electrode connected to the selected column conductor an electric field for causing a change in the current conduction characteristics of the part of its conduction channel region adjacent the selected column conductor when the difference between the first and second predetermined voltages exceeds a critical voltage so that data is stored at the desired memory location provided by the respective part of the conduction channel region adjacent the selected column conductor of each FET connected to the selected column conductor.

2. A semiconductor memory device according to claim 1, wherein each memory location is defined by a part of the conduction channel region of each of two adjacent FETs with adjacent memory locations being defined by adjacent conduction channel parts.

3. A semiconductor memory device according to claim 1, wherein the field effect transistors comprise insulated gate field effect transistors having a gate insulating region separating the gate electrode from the conduction channel region and wherein the means for storing data at a selected memory location is arranged to apply the first and second predetermined voltages for sufficient time and at a level to establish a sufficient electric field within each FET connected to both the selected row and the selected column conductor to cause the current conduction characteristics of the part of its conduction channel region adjacent the selected column conductor to be altered by charge trapping within the gate insulating region.

4. A semiconductor memory device according to claim 3, further comprising means for erasing data stored within the FET array by applying a predetermined voltage of opposite polarity to and of a magnitude greater than the critical voltage to one or more selected row conductors.

5. A semiconductor memory device according to claim 4, wherein the field effect transistors comprise thin film transistors and the means for reading data stored at a memory location comprises means for applying a fourth predetermined voltage, of opposite polarity to the second predetermined voltage, to the selected column conductor.

6. A semiconductor memory device according to claim 5, wherein the array of thin film transistors comprises a first conductive layer provided on an insulative substrate and divided into a first series of conductive strips which define the gate electrodes of the TFTs integrally with the row conductors, an insulating layer covering the first series of conductive strips and defining the gate insulating regions, a not-intentionally doped semiconductor layer provided on the insulating layer to define the conduction channel regions of the thin film transistors, and a second conductive layer divided into a second series of strips extending transversely of the first series to provide the main electrodes of the TFTs integrally with the column conductors.

7. A semiconductor memory device according to claim 1, further comprising means for reading data from a desired memory location defined by a selected row and a selected column conductor by applying a third predetermined voltage to the selected row conductor and by applying predetermined voltages to the column conductors such that current flows through FETs connected to both the selected row and the selected column conductor in a direction in which the level of current flow is determined primarily by the current conduction characteristics of the part of the conduction channel region adjacent the selected column conductor and means for detecting said current.

8. A semiconductor memory device according to claim 7, wherein the field effect transistors comprise thin film field effect transistors having their gate electrodes on one side and their first and second main electrodes on the other side of the conduction channel region with the first and second main electrodes being isolated from but overlapping the conduction channel region, and wherein the means for reading data stored at a memory location comprises means for applying a fourth predetermined voltage to produce a current flow in the same direction to that which would be produced by the second predetermined voltage.

9. The semiconductor memory device as claimed in claim 1 wherein one of said first and second predetermined voltages comprises a positive voltage and the other one comprises a negative voltage, and wherein said circuitry further comprises means for connecting unselected row and column conductors to ground potential.

10. The semiconductor memory device as claimed in claim 1 wherein said means for applying the first and second predetermined voltages also applies a further predetermined voltage different from the second predetermined voltage to the remaining column conductors.

11. A semiconductor memory device according to claim 10, wherein the means for storing data at a selected memory location is arranged to apply the first second and further predetermined voltages for a sufficient time and at a level to establish a sufficient electric field within each FET connected to both the selected row and the selected column conductor to cause the current conduction characteristics of the part of its conduction channel region adjacent the selected column conductor to be altered by state creation within the conduction channel region.

12. A method of storing data in a semiconductor memory device comprising an array of rows and columns of field effect transistors (FETs) providing memory locations for data, each FET having a conduction channel region extending between first and second main electrodes and a gate electrode for controlling conduction along the conduction channel region, and row and column conductors, the gate electrodes of the FETs in each row being connected to a respective row conductor and the first and second main electrode of the FETs in each column being connected to respective adjacent column conductors so that the second main electrodes of the FETs in one column are connected to the first electrodes of the FETs in any adjacent column, which method comprises applying a first predetermined voltage to a selected row conductor a second predetermined voltage to a selected column conductor and a further predetermined voltage different from the second predetermined voltage to the remaining column conductor for establishing within each FET which has its gate electrode connected to the selected row conductor and one main electrode connected to the selected column conductor an electric field for causing a change in the current conduction characteristics of the part of its conduction channel region adjacent the selected column conductor when the difference between the first and second predetermined voltages exceeds a critical voltage so that data is stored at the desired memory location provided by the respective part of the conduction channel region adjacent the selected column conductor of each FET connected to the selected column conductor.

13. A method according to claim 12, which comprises applying the first, second and further predetermined voltages for a sufficient time and at a level to establish a sufficient electric field within each FET connected to both the selected row and the selected column conductor to cause the current conduction characteristics of the part of its conduction channel region adjacent the selected column conductor to be altered by state creation within the conduction channel region.

14. A method according to claim 12, which comprises providing the field effect transistors as insulated gate field effect transistors each having a gate insulating region separating the gate electrode from the conduction channel region, and applying the first and second predetermined voltages for a sufficient time and at a level to establish a sufficient electric field within each FET connected to both the selected row and the selected column conductor to cause the current conduction characteristics of the part of its conduction channel region adjacent the selected column conductor to be altered by charge trapping within the gate insulating region.

15. A method according to claim 14, which comprises erasing data stored within the array by applying a predetermined voltage of opposite polarity to and of a magnitude greater than the critical voltage to one or more selected row conductors.

16. A method of reading data stored using a method in accordance with claim 12, which method comprises applying a third predetermined voltage to the selected row conductor and applying predetermined voltages to the column conductors such that current flows through any FET connected to both the selected row and the selected column conductor in a direction in which the level of current flow is determined primarily by the current conduction characteristics of the part of the conduction channel region adjacent the selected column conductor, and detecting said current.

* * * * *